United States Patent [19]

Land

[11] Patent Number: 4,627,442
[45] Date of Patent: Dec. 9, 1986

[54] MICROWAVE THERMOGRAPHIC APPARATUS

[75] Inventor: David V. Land, Glasgow, Scotland

[73] Assignee: The University Court of the University of Glasgow, Glasgow, Scotland

[21] Appl. No.: 569,661

[22] Filed: Jan. 10, 1984

[30] Foreign Application Priority Data

Jan. 12, 1983 [GB] United Kingdom ................. 8300779

[51] Int. Cl.$^4$ ............................................. A61N 1/04
[52] U.S. Cl. ..................................... 128/736; 128/653
[58] Field of Search ...................... 128/736, 653, 804; 324/122

[56] References Cited

U.S. PATENT DOCUMENTS

| | | | |
|---|---|---|---|
| 3,777,270 | 12/1973 | Hardy et al. ........................ | 374/122 |
| 4,138,998 | 3/1979 | Nowogrodzki ..................... | 128/653 |
| 4,271,848 | 6/1981 | Turner et al. ...................... | 128/804 |
| 4,315,510 | 2/1982 | Kihn .................................... | 128/402 |
| 4,346,716 | 8/1982 | Carr ..................................... | 128/653 |

FOREIGN PATENT DOCUMENTS 0036040  9/1981  European Pat. Off. ............ 128/804

OTHER PUBLICATIONS

"Simple Microwave . . . Substances", Neelakantaswamy et al., 9/1978.
"Gaussian-Beam Launcher . . .", Neelakantaswamy et al., 5/1977, IEEE.
"Cancer Therapy . . . Radiation", Steffer et al., 6/1977.
"Thermographie Micro-onde", Mamouni et al., 1980.
"Dual-Mode Microwave . . . Cancer", Carr et al., 3/1981.
"MW Interferometers . . . ", Griffin, 5/1978.
"Microwave Reflection . . . Monitoring", Pedersen et al., 1/1978.

*Primary Examiner*—Edward M. Coven
*Attorney, Agent, or Firm*—Leydig, Voit & Mayer

[57] ABSTRACT

Microwave thermography apparatus comprises a signal-receiving aerial (2) which is sensitive to microwave radiation emanating from a body having a mean body temperature. A reference load (1) capable of being maintained at a chosen temperature ($T_O$) and of emitting a thermal noise signal at microwave frequency corresponding to temperature $T_O$, is connected to a receiver (3) the input impedance of which is matched to the impedance of reference load (1) by way of a 3-port non-reciprocal circulator (5). Aerial (2) is connected via a single-throw on/off microwave switch (6) to the input of receiver (3) through the other port of circulator (5). The connections to circulator (5), taken in circulation order, are reference load (1), aerial (2), receiver (3). Aerial (2) is preferentially designed to incorporate a tubular metallic waveguide (10) of circular cross-section dimensioned to support $TE_{11}$ wave mode and the lower order mode, the signal output from the aerial (2) being taken by a coaxial line and the aerial (2) incorporating a broad band waveguide coaxial line mode transformer (11,12) which is arranged to select only the $TE_{11}$ mode for delivery to the coaxial line. The waveguide (10) is filled with a low-loss dielectric material (13) in order to provide the aerial (2) with an impedance close to the mean body tissue impedance (about 80 ohms).

4 Claims, 10 Drawing Figures

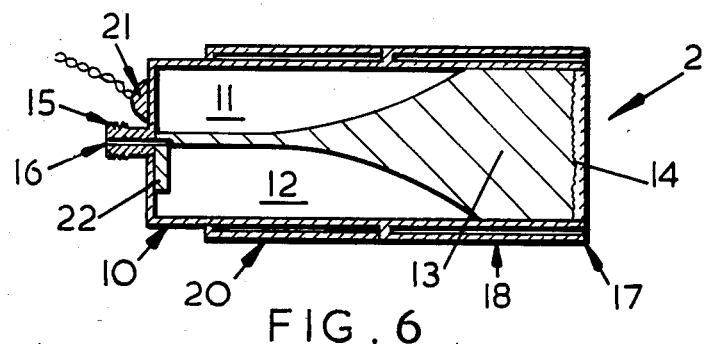
FIG. 6
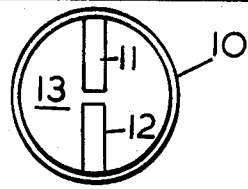
FIG. 9
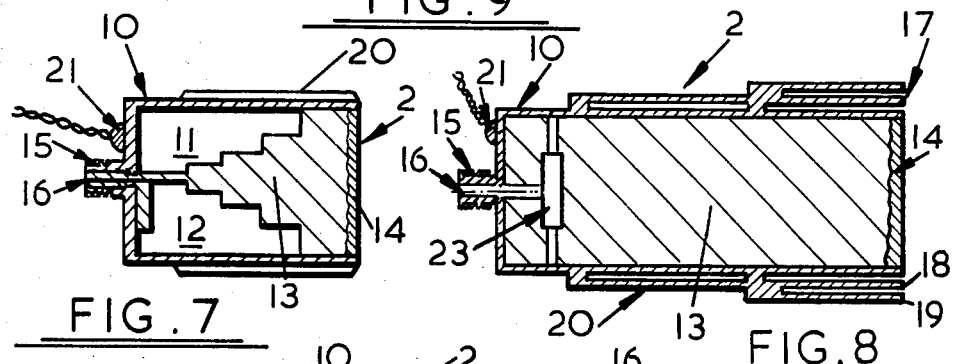
FIG. 7  FIG. 8
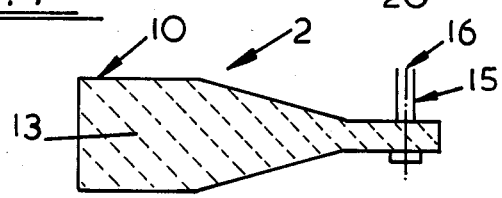
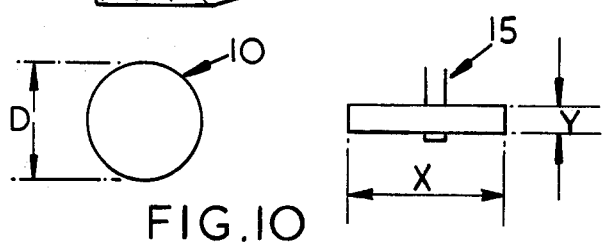
FIG. 10

MICROWAVE THERMOGRAPHIC APPARATUS

This invention relates to apparatus for use in microwave thermography.

Microwave thermography is a known technique for use in diagnosis of bio-medical maladies, which functions by detecting a temperature variation in an affected subcutaneous part of the body with respect to the normal body temperature.

Infra-red thermography, which is also known, is only effective in determining body surface temperatures but waves of longer wavelength than infra-red have the power to penetrate substantial thicknesses of body tissue and it is those waves, referred to simply as microwaves, which are emitted by a deep lying part of a body and reach the surface with sufficient power to the detected. Apparatus used for microwave thermography is thus a form of radio receiver sensitive to waves in the range of frequencies capable of penetrating appreciable thickness, for example several cm, of body tissue. This frequency range is roughly 1–10 GHz. The actual waves produce a "noise signal" the intensity of which is observed and interpreted to give an indication of the temperature of the object from which the wave originated.

A known form of microwave thermography apparatus incorporates a form of comparator receiver known as the Dicke type comprising a reference load which is maintained at a controlled and measured temperature (in practice a temperature close to normal body temperature) generating a reference noise signal corresponding with the controlled temperature, a switching device which feeds the reference noise signal alternately with the noise signal emanating from a sensing aerial placed in proximity to the object the temperature of which is to be investigated to a receiver which combines the signals to produce an output signal of the form $G(T_S-T_O)$ where G represents the receiver gain, $T_O$ represents the signal generated by the reference load and $T_S$ represents the signal from the aerial. The receiver output signal is then added to a signal directly derived from $T_O$ in order to provide a measure of $T_S$ alone.

Since for the frequencies of interest the gain G cannot be highly stabilized in the known apparatus whereas $T_O$ can be accurately measured, $T_O$ is normally chosen and set to be as close as possible to the temperature $T_S$ so that measurement error coming from the unstabilized gain factor of the receiver is made as small as possible.

Any loss of signal in circuits or components at or preceding the input to the receiver degrades the noise figure (or equivalent effective noise temperature) of the receiver. These equivalent parameters (noise figure and effective noise temperature) are a most important measure of the performance of the receiver for this application. Degradation of this parameter causes a proportionate degradation of the source temperature measuring resolution of the apparatus and/or an increase in the measurement time required to achieve a given source temperature measuring resolution. It is therefore important to minimize circuit or component signal losses in the essential circuits and components preceding or at the input of the receiver viz. the aerial, the switch and associated conductors. For the known Dicke receiver the signal switch and its associated signal circuits are significant sources of signal loss.

In practical terms the known Dicke receiver configuration described previously suffers from three disadvantages:

(1) It requires a two-throw switch. Two-throw electro-mechanical switches capable of operating at microwave signal frequencies and having signal path losses acceptably low for the application considered here can be constructed but the rate of switching is severely limited since contact bounce can cause problems and such a switch has a limited operating life at the high switching frequency required to avoid or reduce receiver amplifier and detector flicker noise. Solid-state microwave switches, which normally use semi-conductor diodes for the switched elements, can have a very high switching rate and a very long operating life but a two-throw form of solid state switch has signal losses which are high for the application considered here.

(2) When the switch connects the receiver to the aerial, a thermal noise signal travels from the receiver to the aerial arising from the effective noise temperature of the receiver. At the known forms of aerial there exists a significant signal reflection coefficient for the aerial/source interface which reflects back into the receiver a portion of the receiver noise signal and thus causes the measurement of source temperature to be in error by an amount proportional to this reflected signal.

(3) The existence of a significant reflection coefficient as described in (2) above, which is equivalent to an impedance mis-match, causes the gain of the receiver to change from the gain obtained when the input of the receiver is connected by the switch to the matched impedance reference load. The change of gain, occurring as it does at the switching frequency, causes a spurious output signal from the receiver and hence an error in the measurement of the source temperature.

Since the observable difference in temperature between normal and diseased tissue can be and often is less than 1 Celsius degree the need for high accuracy in the temperature resolution of the apparatus will be understood.

According to the present invention there is provided apparatus for use in microwave thermography, said apparatus comprising a signal-receiving aerial sensitive to microwave radiation emanating from a body having a mean body temperature, a reference load capable of being maintained at a chosen temperature substantially equal to said mean body temperature and of emitting a thermal noise signal at microwave frequency corresponding to that temperature, a receiver having an input impedance matched to the impedance of said reference load and incorporating means for comparing the thermal noise signals emanating from said aerial and from said reference load, and a three-port non-reciprocal circulator interconnecting said aerial, reference load and receiver, said circulator having respective ports taken in circulation order connected to the noise-signal output of said reference load, to the aerial via a single throw on-off microwave switch, and to the receiver input.

Further according to the present invention there is provided apparatus for use in microwave thermography, said apparatus comprising a signal-receiving aerial sensitive to microwave radiation emanating from a body having a mean body temperature, said aerial comprising a tubular metallic waveguide of circular cross-section dimensioned to support up to and including the $TE_{11}$ wave mode, a broad-band-waveguide to coaxial-line mode transformer arranged to select the $TE_{11}$ mode for delivery into a coaxial line connected to the signal output of the aerial, and a filling of low-loss dielectric material within the waveguide such that the aerial has an impedance close to the mean body tissue impedance.

The present invention will now be exemplified with reference to the accompanying drawings and description, wherein in the drawings:

FIG. 1 diagramatically illustrates a known form of apparatus for use in microwave thermography;

FIG. 2 diagramatically illustrates a form of apparatus for use in microwave thermography in accordance with the present invention;

FIGS. 6, 7 and 8 are sectional views through different forms of aerial;

FIG. 9 is a sectional end view of the FIG. 6 aerial; and

FIG. 10 illustrates a further form of aerial.

Figure 1:
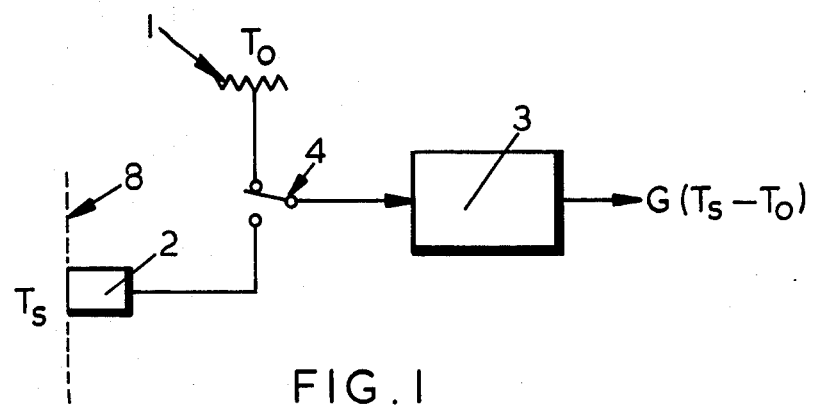

In the drawings 1 denotes a reference resistive load thermally controlled to operate at a selected reference temperature $T_O$ and which provides a corresponding microwave frequency noise signal output; 2 denotes an aerial the purpose of which is to receive microwave radiation from the body under investigation, said radiation emanating from a source of temperature $T_S$; and 3 denotes a receiver arranged to amplify signals applied to it and indicate in intelligible form the chosen characteristics of the signals so received. In the known apparatus illustrated in FIG. 1, 4 denotes a two-way switch arranged to oscillate between its two positions in one of which the load 1 is connected to the receiver 3 and in the other of which the aerial 2 is put into connection with the receiver 3.

In operation of the know device of FIG. 1 the aerial 2 is placed in contact with a body and the switch 4 caused alternately to connect the aerial 2 and the reference load 1 to the receiver 3. When the aerial 2 is connected to the receiver the signal $T_S$ from the aerial 2 is passed to the amplifier then when the switch breaks the connection to the aerial it connects the reference load to the receiver and the reference signal $T_O$ is fed to the receiver so that the receiver issues an amplified difference signal at the switching frequency the level of amplification depending upon G, the gain of the receiver.

Figure 3:
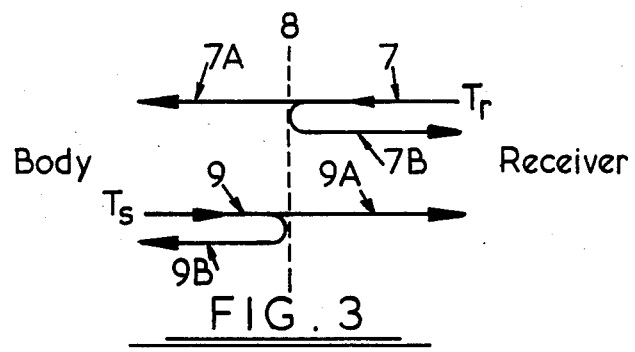
FIG. 3 is a diagram illustrating the effects of signal reflection at the body surface/aerial interface for the FIG. 1 apparatus.

In FIG. 3 the line 8 represents the body surface/aerial interface at which an impedance mismatch reflection coefficient $\rho$ occurs. The source temperature viewed by the aerial is $T_S$ and the receiver 3 has an input effective noise temperature of $T_R$. When switch 4 connects the aerial to the receiver the noise signal originating from the receiver input follows the path 7 to interface 8 there to be partly reflected along path 7B as a signal of magnitude $\rho\ T_R$. The partly transmitted receiver-noise signal which follows the path 7A into the body is assumed to be absorbed and has no further effect. The signal from source $T_S$ initially follows the path 9, and is partly reflected from the interface 8 along the path 9B with subsequent absorption in the body, and partly transmitted along the path 9A into the receiver with magnitude of signal $(1-\rho)T_S$. The resultant receiver signal is then $T_S+\rho(T_R-T_S)$ and measurement error of source temperature $T_S$ resulting from the impedance mismatch reflective coefficient can only be zero when $T_R$ is equal to $T_S$ which is not a practical possibility since $T_R$ is not readily controllable. However this measurement error can be minimised by minimising reflection coefficient $\rho$ and for this purpose it is necessary to design aerial 2 to have an impedance which is as close as possible to the mean body-tissue impedance as will be explained. Of course, when switch 4 connects the reference load 1 to the receiver 3, because the load impedance is matched there is an absence of reflection of the receiver input noise signal and the signal delivered to the receiver is simply $T_O$.

As has been explained previously the known Dicke-type receiver (see FIG. 1) suffers from the three particular disadvantages of (1) limited switching frequency and short operating life or relatively high signal loss, (2) receiver effective input temperature reflected error signals, and (3) error signal production by modulation of the receiver gain at the switching frequency resulting from aerial impedance mis-match. The arrangement of the components at the input of the receiver as shown in FIG. 2 is intended largely to overcome the above stated disadvantages.

Figure 2:
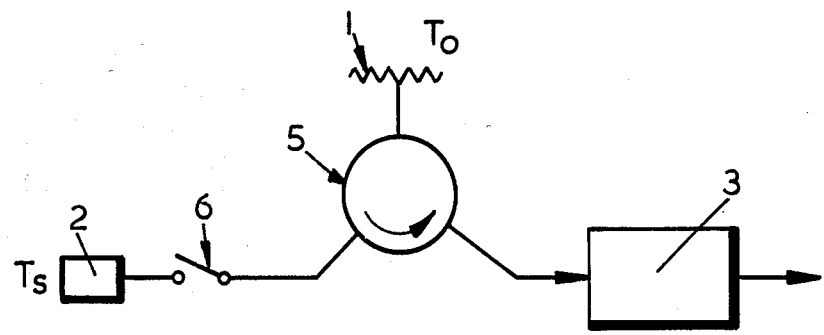
Figure 4:
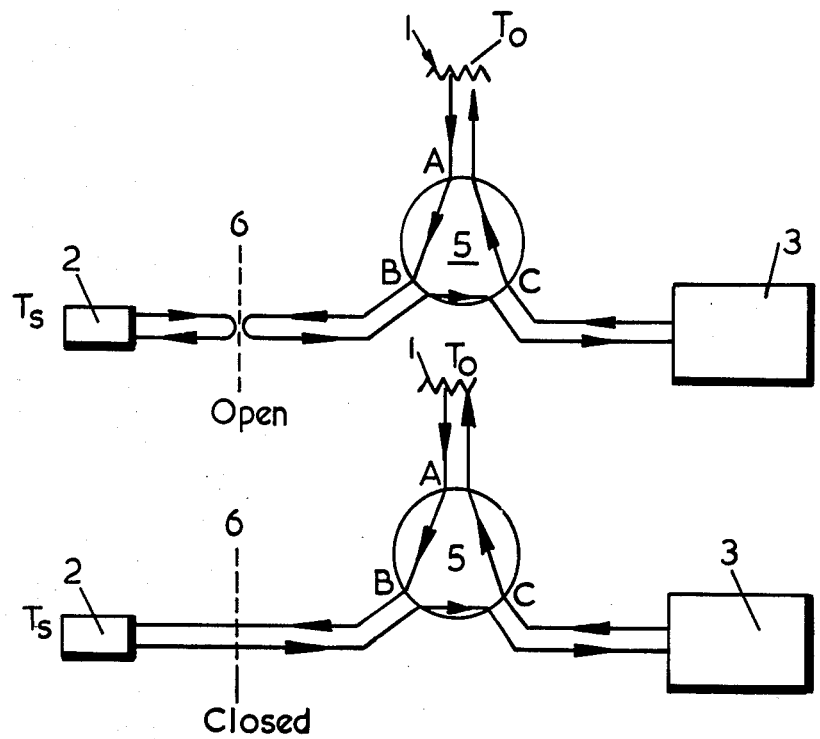
FIG. 4 illustrates the signal paths taken in the apparatus of FIG. 2 firstly with the switch in its open position and secondly with the switch in its closed position.

In FIG. 2, 5 denotes a 3-port microwave circulator of the non-reciprocal type, for example a ferrite circulator, the ports being connected in order firstly to the output of the reference load 1, secondly to the aerial 2 by way of a single-throw on-off microwave switch 6, and thirdly to the receiver 3. The circulator 5 and the single-throw switch 6 are the essential component parts which provide the advantages of Dicke comparator receiver type operation while largely overcoming the above stated disadvantages. In FIG. 2 the reference load is always connected into the circulator 5 and the receiver 3, and the switch 6 has the function only of connecting and disconnecting the aerial 2 to and from the circulator 5. FIG. 4 shows the paths taken by the signals from the reference load, from the receiver input, and from the aerial. The signal paths through the non-reciprocal circulator itself are (with reference to FIG. 4) A to B, B to C, and C to A. The practical construction of such a circulator is such that the signal loss along these paths is acceptably small for the application considered here and the isolation provided between the ports A, B and C in the reverse direction is such that signal transmission in such reverse direction can be neglected.

The single-throw switch 6 used in the arrangement of FIG. 2 has, in the practical form of a solid-state diode (not transistor) switch, a significantly lower signal loss than the two-throw switch of the known arrangement of FIG. 1 which as previously explained is of great importance. Where the switch 6 is in the open position it presents an open circuit or very large impedance mismatch to signals travelling towards it from either the aerial 2 or the circulator 5 and these signals will thus experience complete or nearly complete reflection at the switch.

With the switch 5 in the open position the signal path is, with reference to FIG. 4, from the reference load 1 at temperature $T_O$ through the circulator 5 from A to B, from the port B of the circulator 5 to the opencircuit of the switch 6 where it is reflected back to the port B of the circulator 5, through the circulator 5 from B to C and hence into the receiver 3. The noise signal resulting from the input effective noise temperature ($T_R$) passes through the circulator 5 from C to A to the reference load 1 which is impedance matched so that there is an absence of any reflected signal. The source signal ($T_S$) is totally reflected at switch 6 and therefore does not enter circulator 5. The output signal from the receiver will for this case be $GT_O$ where G is the gain of the receiver amplification stage.

With the switch 6 in the closed position the receiver input effective noise temperature signal traverses circulator 5 from port C to port A but gives rise to no reflection because reference load 1 is impedance matched. However the signal from reference load 1 at temperature $T_O$ now passes through the circulator 5 from A to B and through the switch 6 to the aerial 2 where it is partly reflected at interface 8 in a manner similar to that explained with reference to FIG. 3 and therefore combines with the part transmitted signal emanating from the source at temperature $T_S$ to be delivered from aerial 2 through the switch 6, into the circulator 5 from B to C and hence to the receiver 3. If the reference load temperature $T_O$ is set at or close to the source temperature $T_S$, which is a practical possibility, the measurement error resulting from aerial impedance mismatch reflection is eliminated or minimized. The output signal from the amplifier will be $GT_S$ for this case.

The receiver output arising from the repeated switching of switch 6 is then the difference between the two cases described above, that is $G(T_S-T_O)$, and it will be seen that because the temperature of the reference load is chosen to be at or close to the source temperature $T_S$ there is a minimum dependency upon gain G. Furthermore by virtue of using circulator 5 and matched load 1 the second of the disadvantages previously described of the known Dicke comparator receiver configuration is avoided. A still further improvement in measurement efficiency can be achieved by design of aerial 2 in the manner which has been explained whereby the reflection coefficient $\rho$ is minimized.

Figure 5:
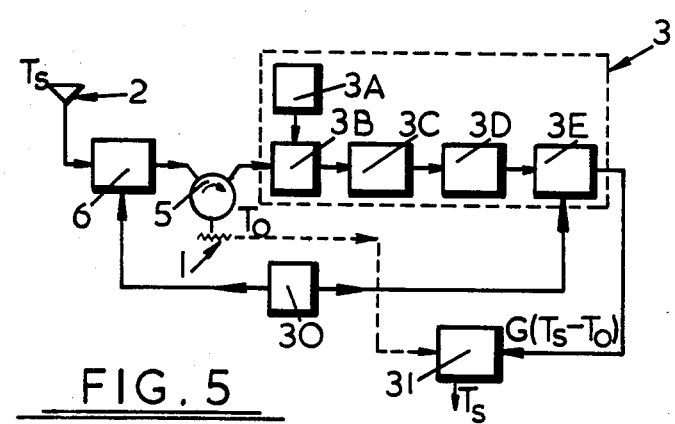
FIG. 5 is a block diagram of a complete microwave thermography system incorporating the FIG. 2 apparatus.

By way of example FIG. 5 illustrates the FIG. 2 arrangement forming part of a complete microwave thermography apparatus from which it will be observed that receiver 3 is of the known superheterodyne type incorporating local oscillator 3A set at 3.1 GHz, mixer 3B operating in the band 2.6–3.6 GHz, intermediate frequency amplifier/detector 3C operating over the 5–500 MHz band, low frequency amplifier 3D operating at about 1 KHz and coherent detector 3E which is switched in common with switch 6 by means of a 1 KHz modulator 30. The output from receiver 3 is delivered to a processor 31 together with a signal directly obtained from reference load 1 in order for the processor 31 to output a signal proportional only to $T_S$.

Turning now to the preferred design of aerial 2 it will be appreciated that the electromagnetic wave impedance of body tissues is normally between 60 and 150 ohms and the impedance of normal still air is in the region of 377 ohms. If the microwave transmission had to pass through air there would be a large signal loss by reflection at the interface between the body surface and the air (in addition to attenuation losses). For this reason the aerial is designed to present an impedance similar to the body tissue impedance and, in use, is pressed against the surface of the body so that the air interface is removed. The aerials to be described are of circular cross-section dimensioned to propagate fields of $TE_{11}$ mode and less because the $TE_{11}$ mode provides the lowest reflection coefficient at the signal-receiving end of the aerial and the best source positional resolution within the near field. The impedance of the aerial is dependent upon its dimensions and upon a filling of low-loss dielectric material so that selection of the dielectric material enables the wave impedance of the aerial to be near the mean impedance of the body tissues. The aerials additionally are capable of operating over a wide bandwidth, of the order of several hundred megahertz, and have low loss.

In FIGS. 6, 7 and 8 the aerial 2 is formed by a metallic circular cross-section waveguide tube 10 filled with low-loss dielectric material 13 held in place by a seal 14 formed by a disc of epoxy resin inserted into the mouth or signal-receiving end of the tube 10. At the signal-output end the tube 10 has a metallic closure penetrated by connections 15,16 of a standard coaxial cable connector. Because tube 10 is arranged to support $TE_{11}$ mode and the lower mode ($TM_{01}$) the aerial also includes a mode transformer whereby only the $TE_{11}$ mode signal is delivered into the coaxial cable connector. In the FIGS. 6 and 7 embodiments this mode transformer is in the form of two radial fins 11, 12 within tube 10 disposed in line opposite one another but separated as shown in end view in FIG. 9. In FIG. 6 the fins are peripherally contoured to the shape of an exponential curve so that the gap between the fins varies exponentially from a maximum at the signal-receiving end of the aerial to a minimum at the signal output end. In FIG. 7 the fins 11, 12 are peripherally formed with steps having the average effect of an exponential gap. Connection 15 is made to fin 11 and connection 16 is made to fin 12 which additionally incorporates a quarter-wave section 22 to present a high impedance at the junction with connection 16. In the FIG. 8 embodiment the mode transformer comprises a rod 23 extending diametrically across tube 10 and connected to conductor 16, conductor 15 being connected directly to tube 10. The mode transformers of FIGS. 6 and 7 are preferred to that of FIG. 8 because the fin contouring provides a smooth transition for the electromagnetic fields between the waveguide tube 10 and the coaxial transmission line and additionally causes the aerial to operate over a relatively wide bandwidth.

For the purpose of eliminating unwanted external surface currents on the tube 10 the aerial 2 additionally incorporates a quarter-wave choke 17 at its signal-receiving end. In the FIG. 6 embodiment this choke 17 is in the form of a single coaxial sleeve 18 externally secured to the pertaining end of tube 10 and forming a coaxial annular air gap. In the FIG. 8 embodiment the choke 17 is in the form of first and second coaxial sleeves 18, 19 each forming a coaxial annular air gap, the axial length of the gap between sleeves 18 and 19 being less than that of the gap between sleeve 18 and tube 10.

For the purpose of maintaining aerial 2 at approximately body temperature thereby to eliminate the unwanted effect of heat flow from the body to the aerial which would introduce measurement error, the aerial 2 additionally comprises a heater 20 which may be either in the form of a heating coil or a heating blanket disposed exteriorly of tube 10 and preferably thermostatically controlled for example by sensor 21 connected in a feedback loop with the drive to heater 20. Heater 20 and sensor 21 are shown in each of FIGS. 6,7 and 8.

The aerials 2 which have been described are intended to provide mode transformation over as short a distance as possible whilst providing the necessary bandwidth and at the same time minimising axial aerial length so that the volume of dielectric material is minimised, the latter being important because the dielectric material is the main source of signal loss in the aerial. One size of aerial 2 which has been found to be suitable comprises tube 10 being between 5 and 10 cm in length and 2.5 cm in diameter with fins 11, 12 each made of brass or copper 6 mm thick, the dielectric material being EccoFlo Hi-K 12 which has a relative dielectric constant in the range 10–50 approximately.

In a still further embodiment, illustrated in FIG. 10, the aerial 2 comprises circular-section copper tube 10 at the signal-receiving end which is mandrel-shaped into a rectangular section waveguide at the signal-output end, the transition between circular and rectangular sections being of the order of two wavelengths or greater in length and thereby providing mode transformation to the coaxial line connector connected into the rectangular section which itself only propagates the $TE_{01}$ mode. The propagation requirements for both cross-sectional shapes are simultaneously met provided that $X>0.853$ D and $Y<0.718$ D where D is the diameter of the circular section, X and Y being the rectangular section dimensions. As previously the tube 10 is dielectric filled.

The advantages of the described embodiments of the present invention over known thermographic apparatus may be summarized as, firstly, a solid-state switch of a form having an acceptable signal loss is used giving the advantages of high switching frequency, with consequently improved receiver performance, and long operating life; secondly a single reference load of measured and controlled temperature is used simultaneously to meet the requirements for independence of temperature measurements from amplifier gain variation and the minimization of aerial impedance mis-match induced measurement error; and thirdly a constant, matched impedance is presented to the input of the receiver at all times and impedance mis-match gain modulation at the switching frequency is prevented.

I claim:

1. Apparatus for use in microwave thermography, said apparatus comprising a signal-receiving aerial sensitive to microwave radiation emanating from a portion of a living-tissue body, said body having a mean body temperature and a mean tissue impedance and said aerial having an output for delivering a thermal noise signal representative of said microwave radiation, a single-throw on-off solid state diode microwave switch connected to said aerial output, a fixed-impedance reference load which is maintained at a predetermined temperature substantially equal to said mean body temperature and said reference load having an output capable of emitting a thermal noise signal at microwave frequency corresponding to that predetermined temperature, a receiver having an input with an input impedance matched to the impedance of said reference load said receiver having an output and switchable detection means for establishing at said output the difference between the thermal noise signals delivered to the receiver input and emanating from said aerial and from said reference load, synchronous switching means connected to drive said detection means and said solid-state diode microwave switch, a three-port non-reciprocal circulator interconnecting said aerial, reference load and receiver, said circulator having respective ports taken in circulation order connected to the noise-signal output of said reference load, to the output of the aerial via said single-throw on-off diode microwave switch, and to the receiver input, and adding means connected to the output of the receiver and to the output of the reference load for establishing a measure of the temperature of said body portion.

2. Apparatus as claimed in claim 1, wherein said non-reciprocal circulator is a ferrite circulator.

3. Apparatus as claimed in claim 1, wherein said aerial comprises a tubular metallic waveguide having a radiation receiving end of circular cross-section dimensioned to receive radiation modes up to and including $TE_{11}$, said tubular metallic waveguide having a signal output end incorporating a coaxial cable connection, a broadband-waveguide to coaxial-line mode transformer connected between the receiving end and the output end of said tubular metallic waveguide and arranged to deliver only radiation of the $TE_{11}$ mode to the coaxial cable connection, and the interior of the tubular metallic waveguide being filled with low-loss dielectric material providing the aerial with a planar radiation-receiving-end face and a receiving-end impedance close to the mean tissue impedance of said body.

4. Apparatus as claimed in claim 3, wherein said radiation receiving end impedance is in the range 60 to 150 ohms.

* * * * *